United States Patent
Opris

(10) Patent No.: US 7,663,526 B1
(45) Date of Patent: Feb. 16, 2010

(54) ANALOG-TO-DIGITAL CONVERTER ARCHITECTURE AND METHOD WITH REDUCED NON-LINEARITY

(76) Inventor: Ion E. Opris, 2198 Lark Hills Ct., San Jose, CA (US) 95138

( * ) Notice: Subject to any disclaimer, the term of this patent is extended or adjusted under 35 U.S.C. 154(b) by 0 days.

(21) Appl. No.: 11/288,930

(22) Filed: Nov. 29, 2005

(51) Int. Cl.
 *H03M 1/12* (2006.01)
(52) U.S. Cl. .......................... 341/172; 341/155
(58) Field of Classification Search .............. 341/155, 341/172, 161
 See application file for complete search history.

(56) References Cited

U.S. PATENT DOCUMENTS

| | | | |
|---|---|---|---|
| 4,760,376 A * | 7/1988 | Kobayashi et al. | 341/155 |
| 5,416,485 A * | 5/1995 | Lee | 341/172 |
| 5,710,563 A | 1/1998 | Vu et al. | |
| 6,320,530 B1 * | 11/2001 | Horie | 341/163 |
| 6,420,991 B1 * | 7/2002 | Yu | 341/161 |
| 6,600,440 B1 * | 7/2003 | Sakurai | 341/172 |
| 6,617,992 B2 * | 9/2003 | Sakurai | 341/161 |
| 7,030,801 B2 * | 4/2006 | Luo | 341/155 |
| 2007/0035432 A1 * | 2/2007 | Gulati et al. | 341/155 |

* cited by examiner

*Primary Examiner*—Peguy JeanPierre

(57) ABSTRACT

An analog-to-digital converter circuit and method with reduced non-linearity are described. The circuit includes an amplifier module having at least one active input coupled to at least three capacitor devices. The circuit further includes multiple switches coupled to each respective capacitor device. One switch coupled to each capacitor device is further coupled to an output of the amplifier module, such that each capacitor device can be selectively coupled to the output of the amplifier module. At least one switch coupled to each capacitor device is further coupled to a reference voltage source to receive at least one reference voltage signal. Finally, at least one switch coupled to each capacitor device is further coupled to receive an input voltage signal.

12 Claims, 8 Drawing Sheets

ANALOG-TO-DIGITAL CONVERTER ARCHITECTURE AND METHOD WITH REDUCED NON-LINEARITY

TECHNICAL FIELD

The invention relates generally to the field of analog-to-digital electronic devices, and more particularly, to an analog-to-digital converter architecture with reduced non-linearity.

BACKGROUND

Analog-to-digital (A/D) converters with pipeline architecture are well suited for low power, high speed applications. The pipeline architecture of an A/D converter generally provides high throughput rates and occupy small die areas, which are both desirable and cost efficient in A/D converters. These advantages result from the concurrent operation of each of the multiple stages in the pipeline A/D converter.

FIG. 1 is a block diagram illustrating a conventional conversion stage of a pipeline or cyclic analog-to-digital (A/D) converter. As illustrated in FIG. 1, the conversion stage 100 includes a sample/hold S/H module 110 to receive an analog input voltage $V_{IN}$ 105, a K-bit A/D subconverter module ADSC 120 coupled to an output of the S/H module 110 to estimate the analog input voltage $V_{IN}$ 105 into a digital signal 125 by extracting a predetermined number K of bits from the $V_{IN}$ 105, and a K-bit digital-to-analog (D/A) converter DAC 130 coupled to the ADSC 120 to receive the K-bit signal 125 from the ADSC 120 and to create an analog estimate $V_{DACi}$ 135 of the input voltage $V_{IN}$ 105. A summing circuit 140 coupled to the S/H module 110 and to the DAC 130 subsequently subtracts the analog estimate $V_{DACi}$ 135 from the analog input voltage $V_{IN}$ 105 and transmits the resulting analog residue voltage 145 to an amplifier module $A_V$ 150. The $A_V$ 150 amplifies the residue voltage 145 by a $2^K$ factor to obtain an amplified residue voltage $V_{OUT}$ 155 and transmits the voltage $V_{OUT}$ 155 to a subsequent conversion stage (not shown) of the A/D converter. The amplified residue voltage $V_{OUT}$ 155 can be calculated with the formula $$V_{OUT} = 2^K V_{IN} - V_{DACi}$$

FIG. 2 is a circuit diagram illustrating a conventional 2.5 bit resolution stage implementation for the multistage A/D converter. As illustrated in FIG. 2, the conventional 2.5 bit resolution stage 200 includes an amplifier module 210, capacitor devices 201 through 204 coupled to the inverter input 211 of the amplifier module 210, and several switches, of which switch 221 is coupled to capacitor device 201, switches 222 and 223 are coupled to capacitor device 202, switches 224 and 225 are coupled to capacitor device 203, and switches 226 and 227 are coupled to capacitor device 204. A switch 228 further couples the capacitor device 201 to the output $V_{OUT}$ 213 of the amplifier module 210, and a switch 229 further couples the inverter input 211 of the amplifier module 210 to the ground. Switches 221, 222, 224, and 226 are also coupled to the input voltage $V_{IN}$, while switches 223, 225, and 227 are coupled to a reference voltage source (not shown), to receive a negative reference voltage $-V_{REF}$, a zero voltage reference value, or a positive reference voltage $+V_{REF}$. In FIG. 2, the amplifier module 210 is single-ended. Alternatively, the amplifier module 210 and the entire resolution stage implementation 200 may be fully differential.

During the sampling time period, the switch 229 is closed and the inverter input 211 of the amplifier module 210 is coupled to the ground. The switches 221, 222, 224, and 226 are also closed and the input voltage signal $V_{IN}$ is thus sampled onto the capacitor devices 201 through 204. During the amplifying/hold time period, the switch 228 is closed and the capacitor device 201 is coupled to the output voltage $V_{OUT}$ 213 of the amplifier module 210. The switches 223, 225, and 227 are also closed and the capacitor devices 202 through 204 are coupled to the positive reference voltage $+V_{REF}$, to the negative reference voltage $-V_{REF}$, or to a ground reference voltage value, as described in detail below in connection with FIG. 3.

FIG. 3 is a graph illustrating an ideal transfer function of the conventional 2.5 bit converter stage 200 shown in FIG. 2. As shown in FIG. 3, the thresholds transitions coordinates for the illustrated transfer functions are at:

$-\frac{5}{8}$ Vref, $-\frac{3}{8}$ Vref, $-\frac{1}{8}$ Vref, $+\frac{1}{8}$ Vref, $+\frac{3}{8}$ Vref, and $+\frac{5}{8}$ Vref, or $$V_{th}(k) = \frac{2 \cdot k - 7}{8} \cdot V_{ref} \qquad (1)$$

where k=1, . . . , 6.

The following table shows the capacitor connections in various hold operating regions (for the conventional 2.5-bit/stage operation).

TABLE 1

| Region | C1  | C2    | C3    | C4    | Vout (ideal)      |
|--------|-----|-------|-------|-------|-------------------|
| 1      | Out | −Vref | −Vref | −Vref | 4 * Vin + 3 * Vref |
| 2      | Out | 0     | −Vref | −Vref | 4 * Vin + 2 * Vref |
| 3      | Out | 0     | 0     | −Vref | 4 * Vin + Vref    |
| 4      | Out | 0     | 0     | 0     | 4 * Vin           |
| 5      | Out | 0     | 0     | +Vref | 4 * Vin − Vref    |
| 6      | Out | 0     | +Vref | +Vref | 4 * Vin + 2 * Vref |
| 7      | Out | +Vref | +Vref | +Vref | 4 * Vin + 3 * Vref |

The actual transfer function equations can be calculated as:

$$V_{out} = \frac{C_1 + C_2 + C_3 + C_4}{C_1} \cdot V_{in} + \frac{\sum_{i=k+1}^{4} C_i}{C_1} \cdot V_{ref} \qquad (2)$$

for region k<4;

$$V_{out} = \frac{C_1 + C_2 + C_3 + C_4}{C_1} \cdot V_{in} \qquad (3)$$

for region k=4, and $$V_{out} = \frac{C_1 + C_2 + C_3 + C_4}{C_1} \cdot V_{in} - \frac{\sum_{i=4}^{k-1} C_i}{C_1} \cdot V_{ref} \qquad (4)$$

for region k>4.

The slope in FIG. 3 is constant in all regions and can be calculated as $(C_1+C_2+C_3+C_4)/C_1$.

Assuming some inherent mismatch between the capacitor devices $C_1$-$C_4$:

$$C_i = (1+\alpha_i) \cdot C \quad (5)$$

where $\alpha \ll 1$, and C is an average value of the individual capacitor values $C_i$.

The transition heights between region k to region k+1 can be computed as follows:

for k<4

$$\Delta V_{out} = \frac{C_{k+1}}{C_1} \cdot V_{ref} \quad (6)$$

with the error from the ideal transition height of $V_{REF}$ $$\varepsilon = \Delta V_{out} - Vref = \frac{C_{k+1} - C_1}{C_1} \cdot Vref \approx (\alpha_{k+1} - \alpha_1) \cdot Vref \quad (7)$$

while for k>=4

$$\Delta V_{out} = \frac{C_{k-3}}{C_1} \cdot V_{ref} \quad (8)$$

with the error from the ideal transition height of $V_{REF}$ $$\varepsilon = \Delta V_{out} - Vref = \frac{C_{k-3} - C_1}{C_1} \cdot Vref \approx (\alpha_{k-3} - \alpha_1) \cdot Vref \quad (9)$$

Thus, what is needed is an A/D converter structure and method that will reduce the transition height errors computed above in equations (7) and (9) and, thus, the non-linearities in the A/D converter structure by a factor of 2, with minimal added complexity and no speed or other performance loss.

SUMMARY

An analog-to-digital converter circuit and method with reduced non-linearity are described. The circuit includes an amplifier module having at least one active input coupled to at least three capacitor devices. The circuit further includes multiple switches coupled to each respective capacitor device. One switch coupled to each capacitor device is further coupled to an output of the amplifier module, such that each capacitor device can be selectively coupled to the output of the amplifier module. At least one switch coupled to each capacitor device is further coupled to a reference voltage source to receive at least one reference voltage signal. Finally, at least one switch coupled to each capacitor device is further coupled to receive an input voltage signal.

DETAILED DESCRIPTION

Figure 4:
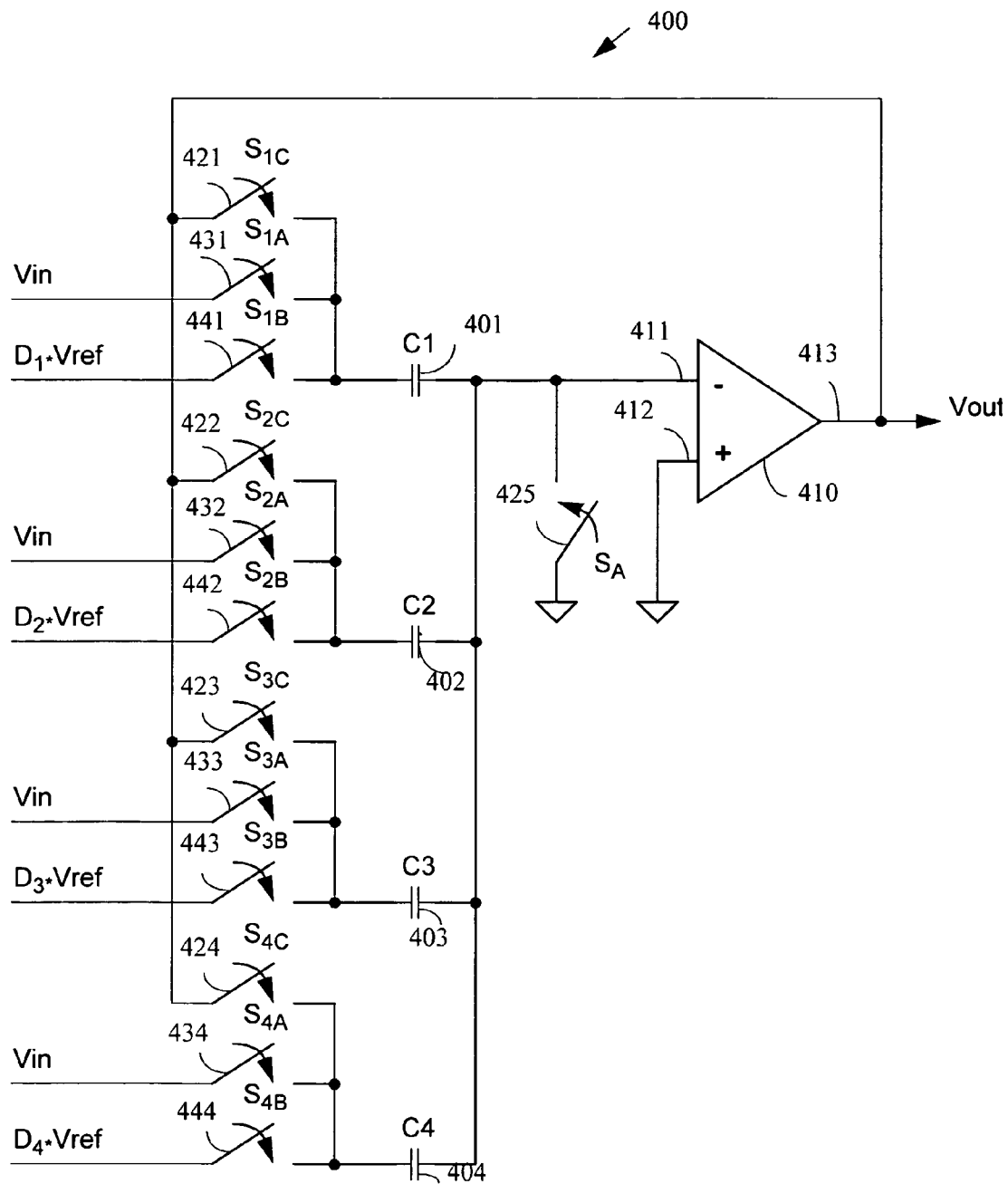
FIG. 4 is a circuit diagram illustrating a 2.5 bit A/D converter architecture, according to one embodiment of the invention.

FIG. 4 is a circuit diagram illustrating a 2.5 bit A/D converter architecture, according to one embodiment of the invention. As illustrated in FIG. 4, in one embodiment, the 2.5 bit A/D converter architecture 400 includes an amplifier module 410, capacitor devices 401 through 404 coupled to the inverter input 411 of the amplifier module 410, and several switches, of which switches 421, 431, 441 are coupled to capacitor device 401, switches 422, 432, and 442 are coupled to capacitor device 402, switches 423, 433, and 443 are coupled to capacitor device 403, and switches 424, 434, and 444 are coupled to capacitor device 404. In one embodiment shown in FIG. 4, the amplifier module 410 is single ended. Alternatively, the amplifier module 410 and the entire converter architecture implementation 400 may be fully differential.

In one embodiment, switches 421, 422, 423, and 424 couple the respective capacitor devices 401 through 404 to the output $V_{OUT}$ 413 of the amplifier module 410, and a switch 425 further couples the inverter input 411 of the amplifier module 410 to the ground. Switches 431, 432, 433, and 434 are also coupled to the input voltage $V_{IN}$, while switches 441, 442, 443, and 444 are coupled to a reference voltage source (not shown), to receive either a negative reference voltage $-V_{REF}$, a ground reference voltage value, or a positive reference voltage $+V_{REF}$, as described in further detail below. In an alternate embodiment, each switch 441, 442, 443, and 444 may be implemented as three switches, each being connected to one reference voltage value, either the negative reference voltage $-V_{REF}$, the ground reference voltage value, or the positive reference voltage $+V_{REF}$.

Figure 1:
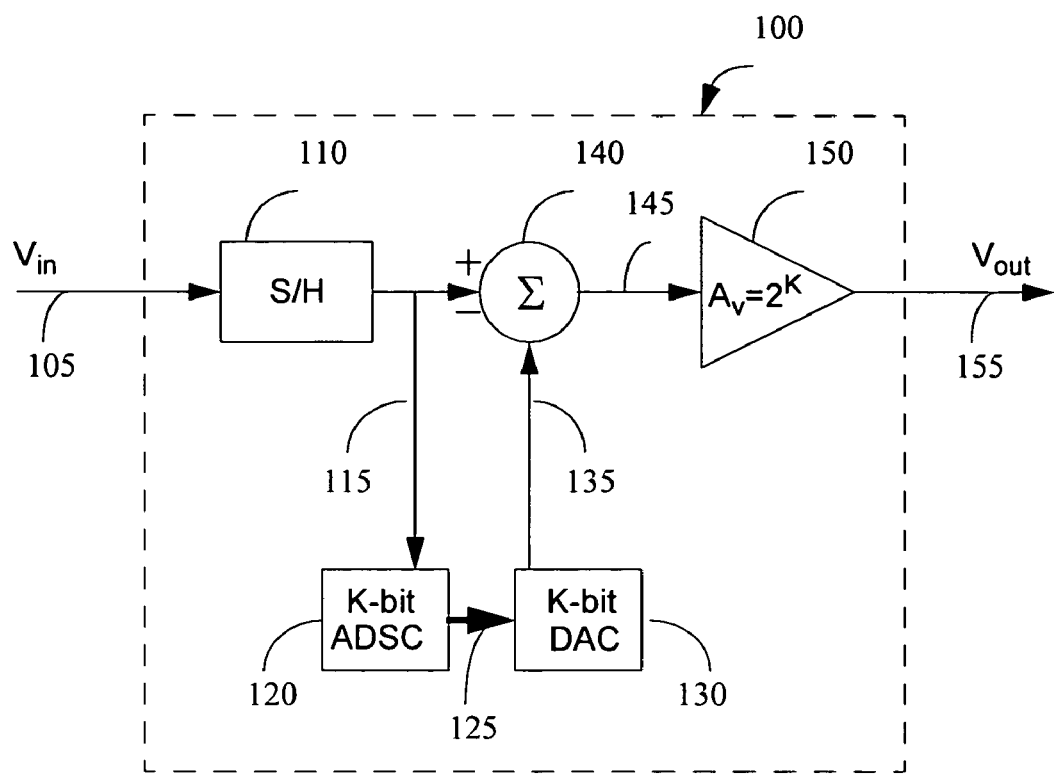
FIG. 1 is a block diagram illustrating a conventional conversion stage in a pipeline or cyclic (algorithmic) analog-to-digital (A/D) converter.
Figure 2:
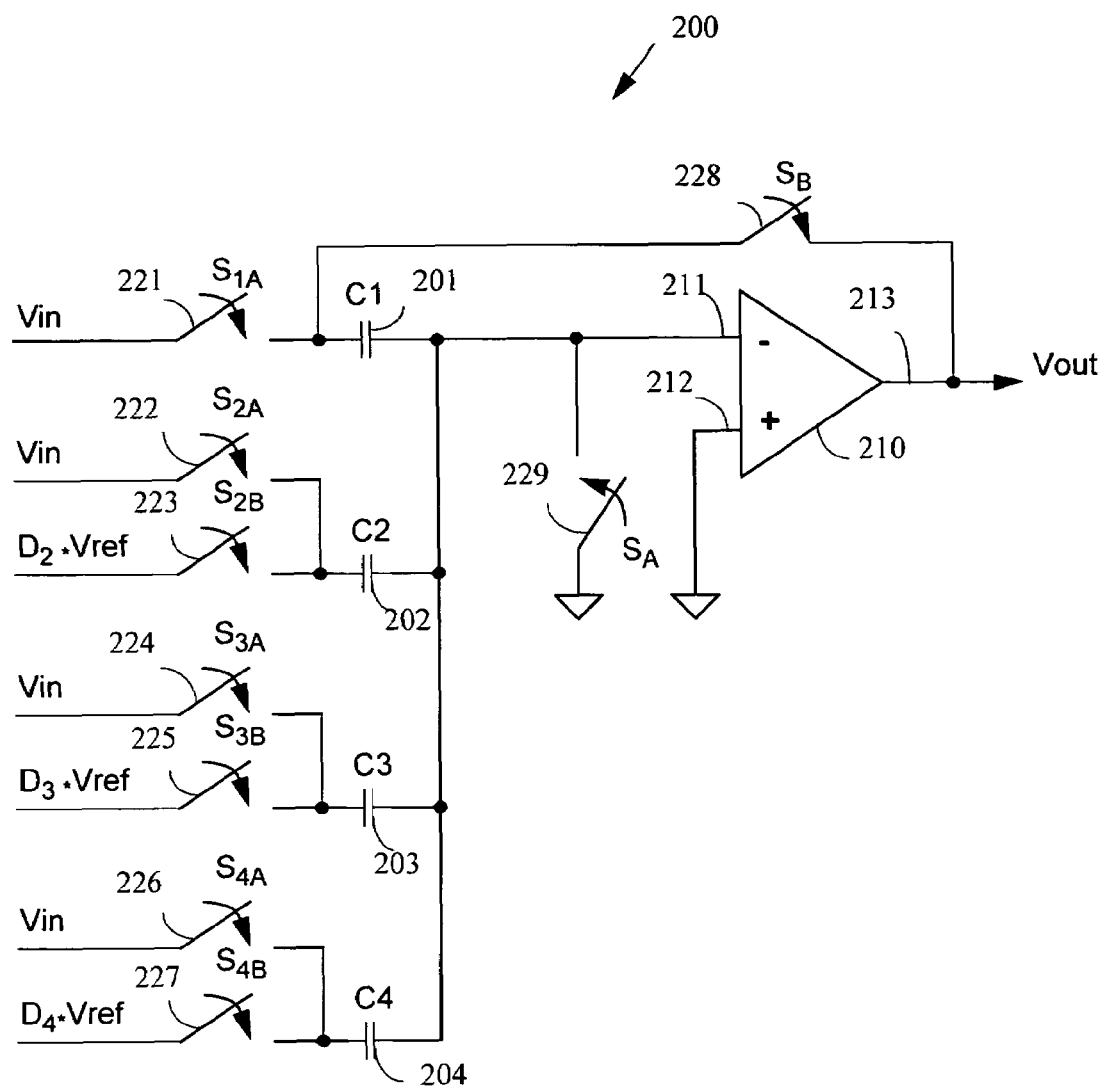
FIG. 2 is a circuit diagram illustrating a conventional 2.5 bit resolution stage implementation for the multistage A/D converter.
Figure 3:
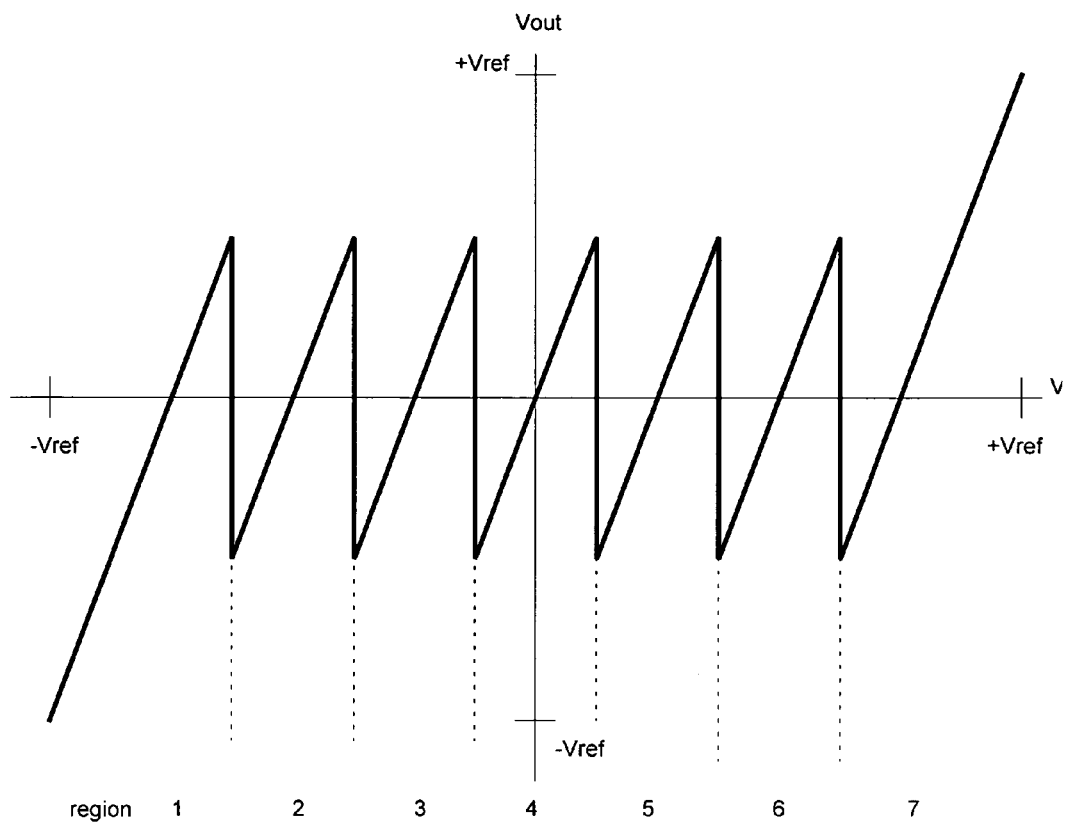
FIG. 3 is a graph illustrating an ideal transfer function of the conventional 2.5 bit converter stage.

In one embodiment, during the sampling time period, the switch 425 is closed and the inverter input 411 of the amplifier module 410 is coupled to the ground. Switches 431, 432, 433, 434 are also closed and the input voltage signal $V_{IN}$ is thus sampled onto the capacitor devices 401 through 404. As a result, each corresponding subconverter comparator module ADSC coupled to the A/D converter 400, and shown, for example, in FIG. 1 as ADSC 120, is triggered to compare the input voltage signal $V_{IN}$ to a preset threshold value to determine an operating region for the A/D converter 400.

In one embodiment, during the amplifying/hold time period, one switch of the switches 421, 422, 423, 424 is selectively closed, and the respective coupled capacitor device 401, 402, 403, or 404 is coupled to the output voltage $V_{OUT}$ 413 of the amplifier module 410. In addition, switches 441, 442, 443, and 444 are also closed and, thus, the respective capacitor devices 401 through 404 are selectively coupled to a value of the reference voltage $V_{REF}$ depending on the specific operating region, as described in further detail below in connection with FIG. 5.

The following table shows the capacitor connections in various hold operating regions:

TABLE 2

| Region | C1   | C2    | C3    | C4    | Vout (ideal)     |
|--------|------|-------|-------|-------|------------------|
| 1      | Out  | −Vref | −Vref | −Vref | 4 * Vin + 3 * Vref |
| 2      | 0    | Out   | −Vref | −Vref | 4 * Vin + 2 * Vref |
| 3      | 0    | 0     | Out   | −Vref | 4 * Vin + Vref   |
| 4      | 0    | 0     | 0     | Out   | 4 * Vin          |
| 5      | 0    | 0     | Out   | +Vref | 4 * Vin − Vref   |
| 6      | 0    | Out   | +Vref | +Vref | 4 * Vin + 2 * Vref |
| 7      | Out  | +Vref | +Vref | +Vref | 4 * Vin + 3 * Vref |

The actual transfer function equations can be written as:

$$V_{out} = \frac{C_1 + C_2 + C_3 + C_4}{C_k} \cdot V_{in} + \frac{\sum_{i=k+1}^{4} C_i}{C_k} \cdot V_{ref} \tag{10}$$

for region k<4, $$V_{out} = \frac{C_1 + C_2 + C_3 + C_4}{C_4} \cdot V_{in} \tag{11}$$

for region k=4, and $$V_{out} = \frac{C_1 + C_2 + C_3 + C_4}{C_{8-k}} \cdot V_{in} - \frac{\sum_{i=4}^{k-1} C_{8-i}}{C_{8-k}} \cdot V_{ref} \tag{12}$$

for region k>4.

Therefore the slope for the corresponding transfer function shown in FIG. 5 below is slightly different in different operating regions of the A/D converter 400.

Figure 5:
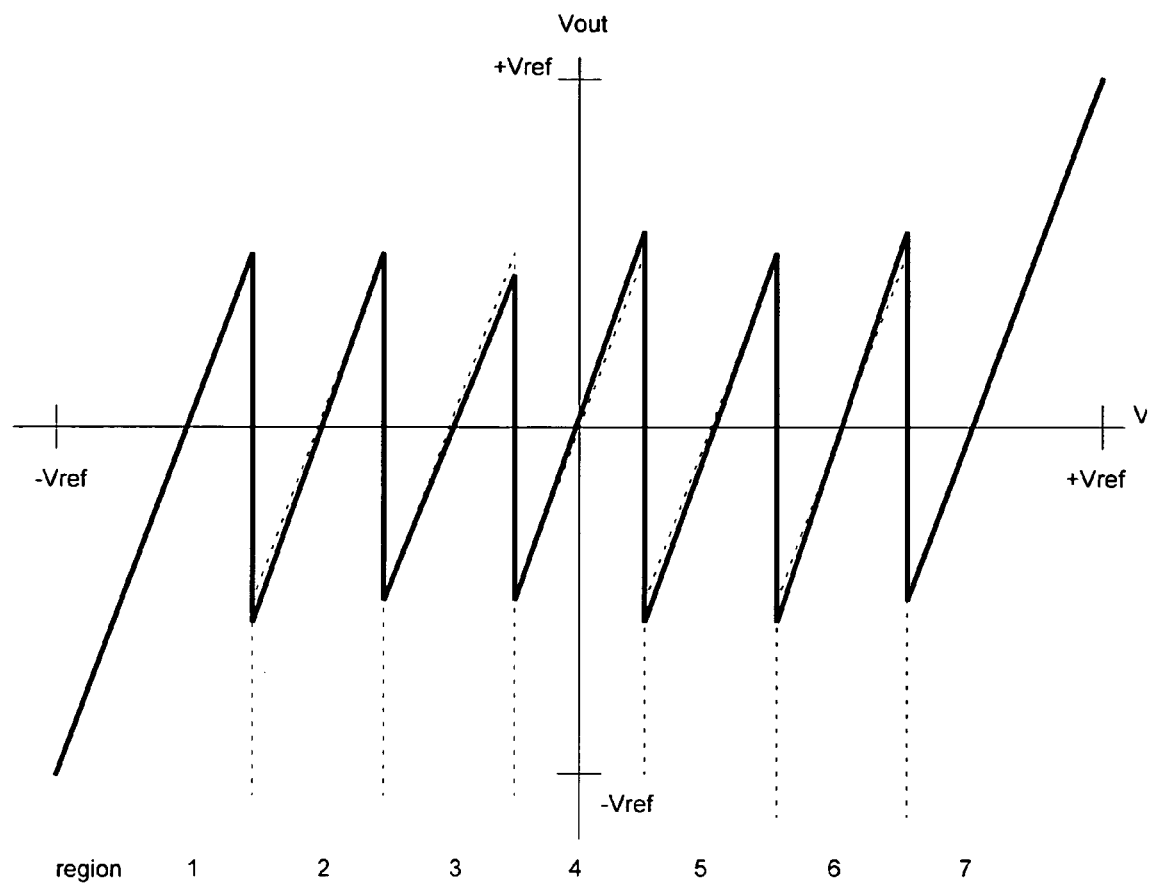
FIG. 5 is a graph illustrating a transfer function of the A/D converter architecture shown in FIG. 4, according to one embodiment of the invention.

FIG. 5 is a graph illustrating a transfer function of the A/D converter architecture shown in FIG. 4, according to one embodiment of the invention. As illustrated in FIG. 5, the transition heights between region k to region k+1 can be computed as follows:

for k<4 the output level at the transition in region k (at the left of the transition) is $$V_{out} = \frac{\sum_{i=1}^{4} C_i}{C_k} \cdot \frac{2 \cdot k - 7}{8} \cdot V_{ref} + \frac{\sum_{i=k+1}^{4} C_i}{C_k} \cdot V_{ref} \tag{13}$$

while the output level at the same transition in region k+1 (at the right of the transition) is $$V_{out} = \frac{\sum_{i=1}^{4} C_i}{C_{k+1}} \cdot \frac{2 \cdot k - 7}{8} \cdot V_{ref} + \frac{\sum_{i=k+2}^{4} C_i}{C_{k+1}} \cdot V_{ref} \tag{14}$$

so the transition height can be expressed as $$\Delta V_{out} \approx \left[ \frac{4 \cdot (2 \cdot k - 7)}{8} \cdot (\alpha_{k+1} - \alpha_k) + (1 + \alpha_{k+1} - \alpha_k) + (3 - k) \cdot (\alpha_{k+1} - \alpha_k) \right] \cdot V_{ref}. \tag{15}$$

The error from the ideal transition height of $V_{REF}$ can be calculated as $$\varepsilon = \Delta V_{out} - Vref \approx \frac{(\alpha_{k+1} - \alpha_1)}{2} \cdot Vref \tag{16}$$

which is half the error calculated with the conventional approach illustrated by the equation (7).

for k>=4 the output level at the transition in region k (at the left of the transition) is $$V_{out} = \frac{\sum_{i=1}^{4} C_i}{C_{8-k}} \cdot \frac{2 \cdot k - 7}{8} \cdot V_{ref} - \frac{\sum_{i=4}^{k-1} C_{8-i}}{C_{8-k}} \cdot V_{ref} \tag{17}$$

while the output level at the same transition in region k+1 (at the right of the transition) is $$V_{out} = \frac{\sum_{i=1}^{4} C_i}{C_{7-k}} \cdot \frac{2 \cdot k - 7}{8} \cdot V_{ref} - \frac{\sum_{i=4}^{k} C_{8-i}}{C_{7-k}} \cdot V_{ref} \tag{18}$$

so the transition height can be expressed as $$\Delta V_{out} \approx \left[ \frac{4 \cdot (2 \cdot k - 7)}{8} \cdot (\alpha_{7-k} - \alpha_{8-k}) + (1 + \alpha_{8-k} - \alpha_{7-k}) + (3 - k) \cdot (\alpha_{8-k} - \alpha_{7-k}) \right] \cdot V_{ref} \tag{19}$$

The error from the ideal transition height of $V_{REF}$ can be calculated as $$\varepsilon = \Delta V_{out} - Vref \approx \frac{(\alpha_{7-k} - \alpha_{8-k})}{2} \cdot Vref \tag{20}$$

which is half the error calculated with the conventional approach illustrated by the equation (9).

Figure 6:
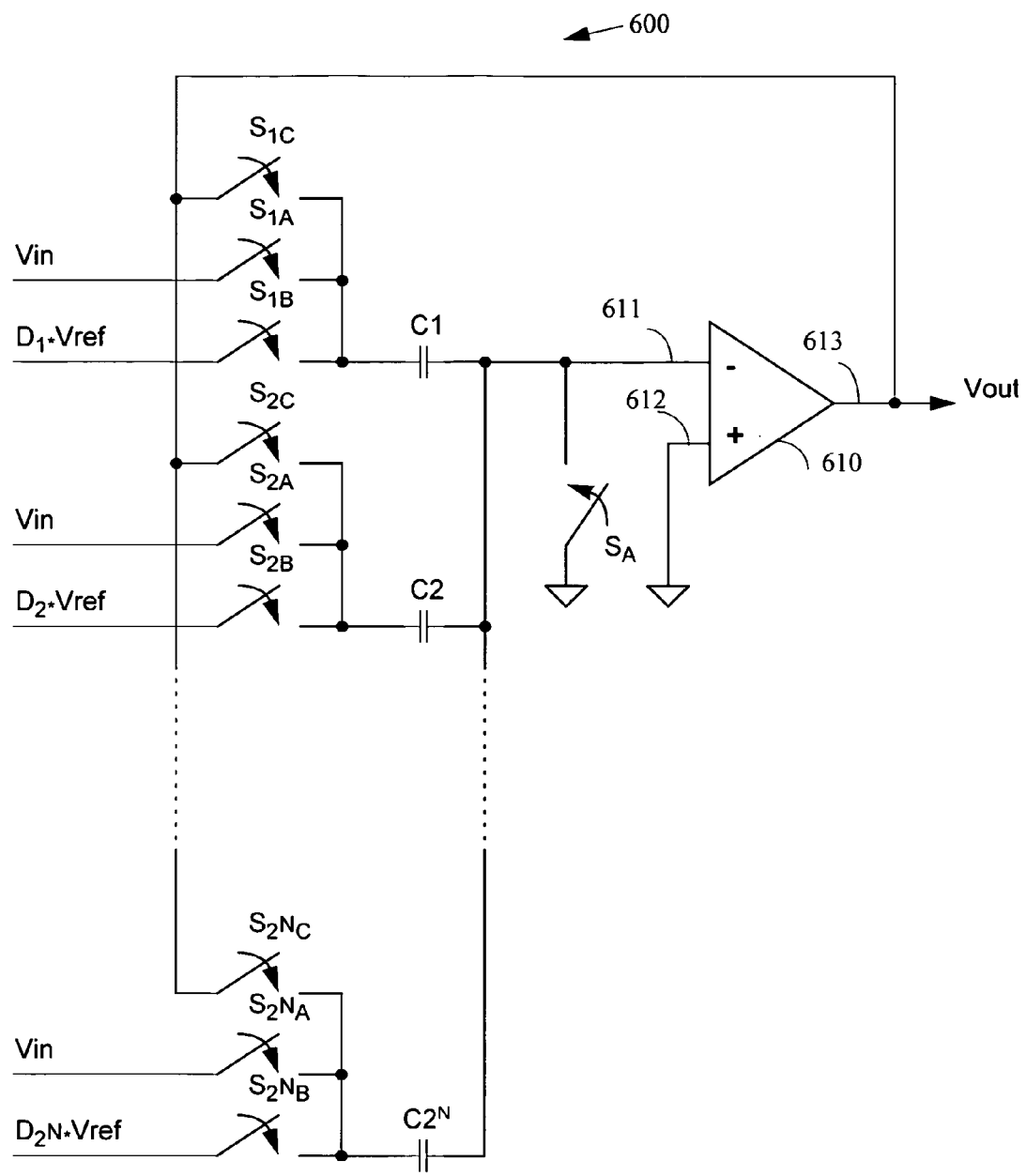
FIG. 6 is a circuit diagram illustrating a N.5 bit A/D converter architecture, according to one embodiment of the invention.

FIG. 6 is a circuit diagram illustrating a N.5 bit A/D converter architecture, according to one embodiment of the invention. As illustrated in FIG. 6, the N.5 bit A/D converter architecture 600 is a generalized implementation for the embodiment described in detail in connection with FIG. 4. In one embodiment, the A/D converter structure 600 includes an amplifier module 610, capacitor devices $C_1$ through $C_2^N$ coupled to the inverter input 611 of the amplifier module 610, and several switches, of which switches $S_{1C}$, $S_{1A}$, and $S_{1B}$ are coupled to capacitor device $C_1$, switches $S_{2C}$, $S_{2A}$, and $S_{2B}$ are coupled to capacitor device $C_2$, and, generally, switches $S_2^N{}_C$, $S_2^N{}_A$, and $S_2^N{}_B$ are coupled to capacitor device $C_2^N$. In one embodiment shown in FIG. 6, the amplifier module 610 is single ended. Alternatively, the amplifier module 610 and the entire converter architecture 600 implementation may be fully differential.

In one embodiment, switches $S_{1C}$ through $S_2^N{}_C$ couple the respective capacitor devices $C_1$ through $C_2^N$ to the output $V_{OUT}$ 613 of the amplifier module 610, and a switch $S_A$ further couples the inverter input 611 of the amplifier module 610 to the ground. Switches $S_{1A}$ through $S_2^N{}_A$ are also coupled to the input voltage $V_{IN}$, while switches $S_{1B}$ through $S_2^N{}_B$ are coupled to a reference voltage source (not shown), to receive a negative reference voltage $-V_{REF}$, a ground reference voltage value, or a positive reference voltage $+V_{REF}$. In an alternate embodiment, each switch $S_{1B}$ through $S_2^N{}_B$ may be implemented as three switches, each being connected to one reference voltage value, either the negative reference voltage $-V_{REF}$, the ground reference voltage value, or the positive reference voltage $+V_{REF}$.

In one embodiment, during the sampling time period, the switch $S_A$ is closed and the inverter input 611 of the amplifier module 610 is coupled to the ground. Switches $S_{1A}$ through $S_2^N{}_A$ are also closed and the input voltage signal $V_{IN}$ is thus sampled onto the respective capacitor devices $C_1$ through $C_2^N$. As a result, each corresponding subconverter comparator module ADSC coupled to the A/D converter 600, and shown, for example, in FIG. 1 as ADSC 120, is triggered to compare the input voltage signal $V_{IN}$ to a predetermined threshold value to determine an operating region for the A/D converter 600.

In one embodiment, during the amplifying/hold time period, one switch of the switches $S_{1C}$ through $S_2^N{}_C$ is selectively closed, and the respective coupled capacitor device $C_1$ through $C_2^N$ is coupled to the output voltage $V_{OUT}$ 613 of the amplifier module 610. In addition, switches $S_{1B}$ through $S_2^N{}_B$ are also closed and, thus, the respective capacitor devices $C_1$ through $C_2^N$ are selectively coupled to a value of the reference voltage $V_{REF}$ depending on the specific operating region, as described in further detail below in connection with FIG. 7.

The following table shows the capacitor connections in various hold operating regions:

TABLE 3

| Region | C1 | C2 | C3 | ... | $C2^N - 1$ | $C2^N$ | Vout (ideal) |
|---|---|---|---|---|---|---|---|
| 1 | Out | −Vref | −Vref | ... | −Vref | −Vref | $2^N * Vin + (2^N - 1) * Vref$ |
| 2 | 0 | Out | −Vref | ... | −Vref | −Vref | $2^N * Vin + (2^N - 2) * Vref$ |
| 3 | 0 | 0 | Out | ... | −Vref | −Vref | $2^N * Vin + (2^N - 3) * Vref$ |
| ... | ... | ... | ... | ... ... | ... | ... | ... |
| $2^N - 1$ | 0 | 0 | 0 | ... | Out | −Vref | $2^N * Vin + Vref$ |
| $2^N$ | 0 | 0 | 0 | ... | 0 | Out | $2^N * Vin$ |
| $2^N + 1$ | 0 | 0 | 0 | ... | 0 | Out | $2^N * Vin - Vref$ |
| ... | ... | ... | ... | ... ... | ... | ... | ... |
| $2^{N+1} - 3$ | 0 | 0 | Out | ... | +Vref | +Vref | $2^N * Vin - (2^N - 3) * Vref$ |
| $2^{N+1} - 2$ | 0 | Out | +Vref | ... | +Vref | +Vref | $2^N * Vin - (2^N - 2) * Vref$ |
| $2^{N+1} - 1$ | Out | +Vref | +Vref | ... | +Vref | +Vref | $2^N * Vin - (2^N - 1) * Vref$ |

The actual transfer function equations can be written as:

$$V_{out} = \frac{\sum_{i=1}^{2^N} C_i}{C_k} \cdot V_{in} + \frac{\sum_{i=k+1}^{2^N} C_i}{C_k} \cdot V_{ref} \quad (21)$$

for region $k < 2^N$;

$$V_{out} = \frac{\sum_{i=1}^{2^N} C_i}{C_{2^N}} \cdot V_{in} \quad (22)$$

for region $k = 2^N$ and $$V_{out} = \frac{\sum_{i=1}^{2^N} C_i}{C_{2^N-k}} \cdot V_{in} - \frac{\sum_{i=2^N}^{k-1} C_{2^N-i}}{C_{2^N-k}} \cdot V_{ref} \quad (23)$$

for region $k > 2^N$.

Therefore the slope for the corresponding transfer function shown in FIG. 7 below is slightly different in different operating regions of the converter 600.

Figure 7:
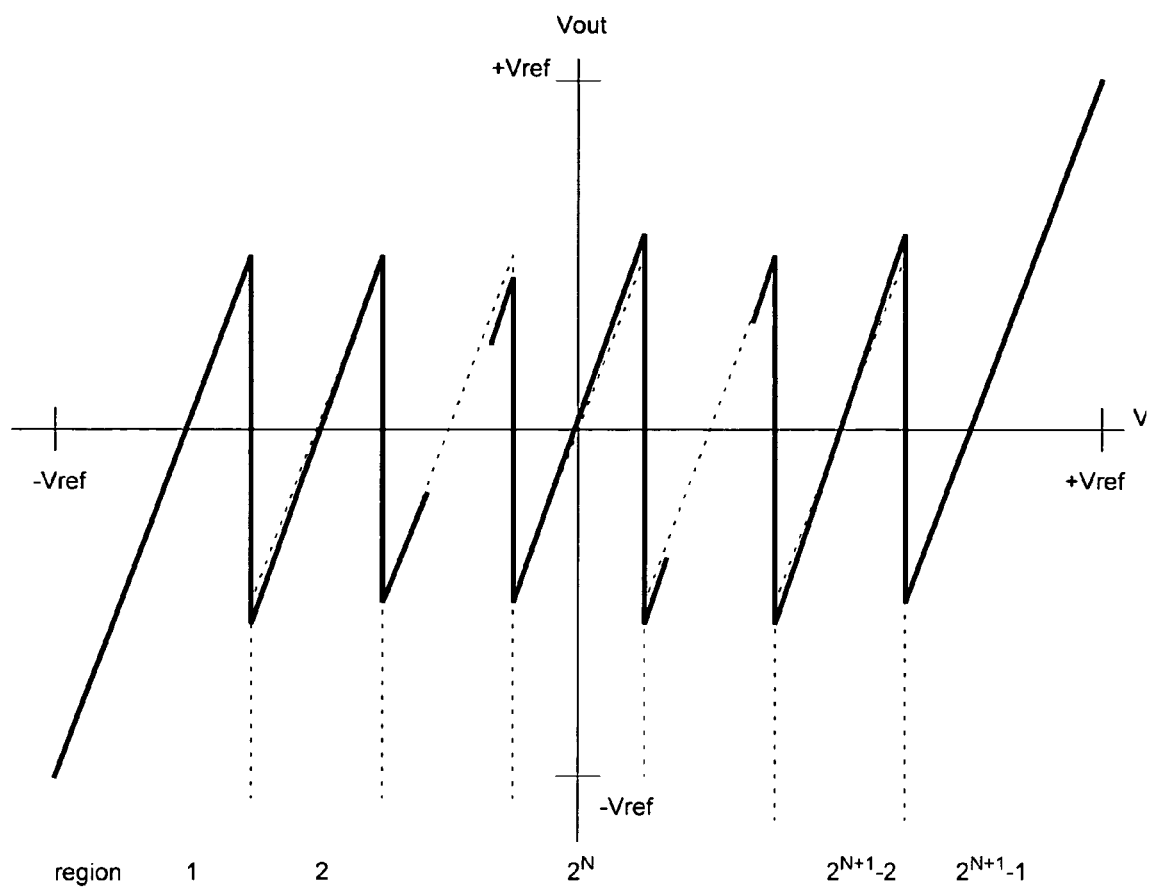
FIG. 7 is a graph illustrating a transfer function of the A/D converter architecture shown in FIG. 6, according to one embodiment of the invention.

FIG. 7 is a graph illustrating a transfer function of the A/D converter architecture shown in FIG. 6, according to one embodiment of the invention. As illustrated in FIG. 7, the thresholds transitions coordinates for the above transfer functions are at:

$-(2^{N+1}-3)/2^{N+1}$ Vref, $-(2^{N+1}-5)/2^{N+1}$ Vref, ... , $-1/2^{N+1}$ Vref, $+1/2^{N+1}$ Vref, ... , $+(2^{N+1}-3)/2^{N+1}$ Vref, $+(2^{N+1}-5)/2^{N+1}$ Vref or $$V_{th}(k) = \frac{2 \cdot k - 2^{N+1} + 1}{2^{N+1}} \cdot V_{ref} \quad (24)$$

where $k = 1, \ldots, 2^{N+1} - 2$.

The transition heights between region k to region k+1 can be computed as follows:

for $k < 2^N$ the output level at the transition in region k (at the left of the transition) is $$V_{out} = \frac{\sum_{i=1}^{2^N} C_i}{C_k} \cdot \frac{2 \cdot k - 2^{N+1} + 1}{2^{N+1}} \cdot V_{ref} + \frac{\sum_{i=k+1}^{2^N} C_i}{C_k} \cdot V_{ref} \quad (25)$$

while the output level at the same transition in region k+1 (at the right of the transition) is $$V_{out} = \frac{\sum_{i=1}^{2^N} C_i}{C_{k+1}} \cdot \frac{2 \cdot k - 2^{N+1} + 1}{2^{N+1}} \cdot V_{ref} + \frac{\sum_{i=k+2}^{2^N} C_i}{C_{k+1}} \cdot V_{ref} \quad (26)$$

Assuming some inherent mismatch between the capacitors $C_1$ through $C_{2^N}$:

$$C_i = (1 + \alpha_i) \cdot C \quad (27)$$

where $\alpha \ll 1$, and C is an average value of the individual capacitor values $C_i$.

The transition height error from the ideal transition height is $$\varepsilon = \Delta V_{out} - Vref \approx \frac{(\alpha_{k+1} - \alpha_1)}{2} \cdot Vref \quad (28)$$

which is half the error of the conventional approach described above.

Similarly, for $k >= 2^N$ the output level at the transition in region k (at the left of the transition) is $$V_{out} = \frac{\sum_{i=1}^{2^N} C_i}{C_{2^N-k}} \cdot \frac{2 \cdot k - 2^{N+1} + 1}{2^{N+1}} \cdot V_{ref} + \frac{\sum_{i=k+1}^{2^N} C_{2^N-i}}{C_{2^N-k}} \cdot V_{ref} \quad (29)$$

while the output level at the same transition in region k+1 (at the right of the transition) is $$V_{out} = \frac{\sum_{i=1}^{2^N} C_i}{C_{2^N-k-1}} \cdot \frac{2 \cdot k - 2^{N+1} + 1}{2^{N+1}} \cdot V_{ref} + \frac{\sum_{i=k+2}^{2^N} C_{2^N-i}}{C_{2^N-k-1}} \cdot V_{ref} \quad (30)$$

so the transition height error from the ideal transition height is $$\varepsilon = \Delta V_{out} - Vref \approx \frac{(\alpha_{2^N-k-1} - \alpha_{2^N-k})}{2} \cdot Vref \quad (31)$$

which is half the error of the conventional approach described above.

Figure 8:
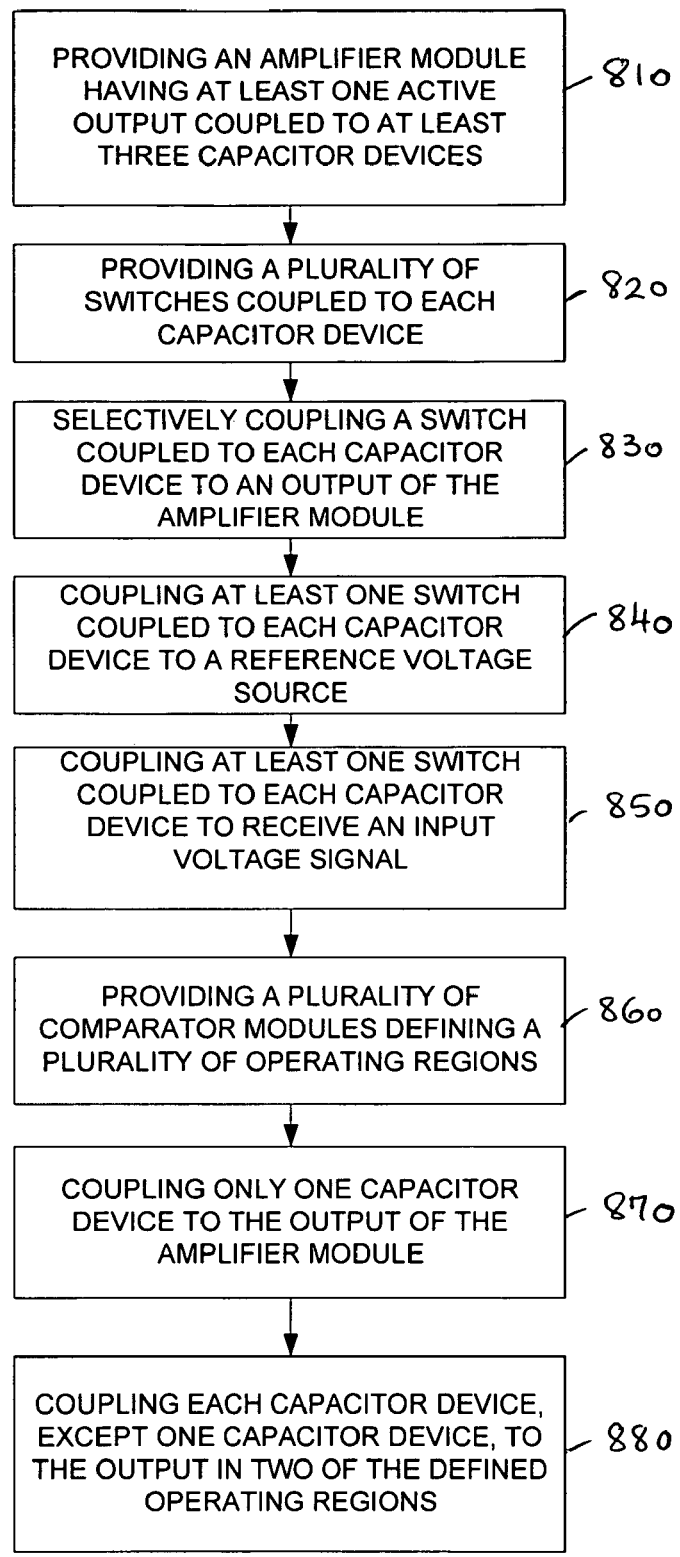
FIG. 8 is a flow diagram illustrating a method to reduce non-linearity in the A/D converter architecture shown in FIGS. 4 and 6.

FIG. 8 is a flow diagram illustrating a method to reduce non-linearity in the A/D converter architecture shown in FIGS. 4 and 6. As illustrated in FIG. 8, in one embodiment, at processing block 810, an amplifier module having at least one active input coupled to at least three capacitor devices is provided.

At processing block 820, a plurality of switches coupled to each respective capacitor device are provided. At processing block 830, a switch of the plurality of switches coupled to each capacitor device is selectively coupled to an output of the amplifier module, such that each capacitor device can be selectively coupled to the output of the amplifier module.

At processing block 840, at least one switch of the plurality of switches coupled to each capacitor device is coupled to a reference voltage source to receive at least one reference voltage signal. At processing block 850, at least one switch of the plurality of switches coupled to each capacitor device is coupled to receive an input voltage signal.

At processing block 860, a plurality of comparator modules are provided, a state of each comparator module defining a plurality of operating regions for the plurality of switches coupled to each respective capacitor device, for the input voltage signal ranging from the negative value of the reference voltage signal to the positive value of the reference voltage signal. At processing block 870, in each operating region, only one capacitor device is coupled to the output of the amplifier module. At processing block 880, each capacitor device, except one predefined capacitor device, is coupled to the output of the amplifier module in two of the defined operating regions.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

The invention claimed is:

1. A circuit comprising:
    at least one conversion stage having a non-integer N.5 bit resolution, wherein N is greater than or equal to 2, each stage further comprising
    an amplifier module having at least one active input coupled to at least three capacitor devices; and
    a plurality of switches coupled to each respective capacitor device;
    a switch of said plurality of switches coupled to said each capacitor device being also coupled to an output of said amplifier module, such that said each capacitor device can be selectively coupled to said output of said amplifier module;
    at least one switch of said plurality of switches coupled to said each capacitor device being also coupled to a reference voltage source to receive at least one reference voltage signal;
    at least one switch of said plurality of switches coupled to said each capacitor device being also coupled to receive an input voltage signal; and
    a plurality of comparator modules, a state of each comparator module of said plurality of comparator modules defining a plurality of operating regions;
    wherein said each capacitor device, except one predefined capacitor device, is coupled to said output of said amplifier module in two operating regions of said plurality of operating regions.

2. The circuit according to claim 1, wherein said amplifier module is single ended, having one active input coupled to said at least three capacitor devices.

3. The circuit according to claim 1, wherein said amplifier module is fully differential, having at least two active inputs coupled to said respective at least three capacitor devices.

4. The circuit according to claim 1, wherein said at least one switch coupled to said reference voltage source further comprises a first switch to receive a negative value of said reference voltage signal, a second switch to receive a ground reference voltage value, and a third switch to receive a positive value of said reference voltage signal.

5. The circuit according to claim 4, wherein said state of each comparator module of said plurality of comparator modules defines said plurality of operating regions for said plurality of switches coupled to said each respective capacitor device, for said input voltage signal ranging from said negative value of said reference voltage signal to said positive value of said reference voltage signal.

6. The circuit according to claim 5, wherein, in each operating region of said plurality of operating regions, only one capacitor device is coupled to said output of said amplifier module.

7. A method comprising:
providing at least one conversion stage having a non-integer N.5 bit resolution, wherein N is greater than or equal to 2, each stage further comprising an amplifier module having at least one active input coupled to at least three capacitor devices;
providing a plurality of switches coupled to each respective capacitor device;
selectively coupling a switch of said plurality of switches coupled to said each capacitor device to an output of said amplifier module, such that said each capacitor device can be selectively coupled to said output of said amplifier module;
coupling at least one switch of said plurality of switches coupled to said each capacitor device to a reference voltage source to receive at least one reference voltage signal;
coupling at least one switch of said plurality of switches coupled to said each capacitor device to receive an input voltage signal;
providing a plurality of comparator modules, a state of each comparator module of said plurality of comparator modules defining a plurality of operating regions; and
coupling said each capacitor device, except one predefined capacitor device, to said output of said amplifier module in two operating regions of said plurality of operating regions.

8. The method according to claim 7, wherein said amplifier module is single ended, having one active input coupled to said at least three capacitor devices.

9. The method according to claim 7, wherein said amplifier module is fully differential, having at least two active inputs coupled to said respective at least three capacitor devices.

10. The method according to claim 7, further comprising:
coupling a first switch of said at least one switch coupled to said reference voltage source to receive a negative value of said reference voltage signal;
coupling a second switch of said at least one switch coupled to said reference voltage source to receive a ground reference voltage value; and
coupling a third switch of said at least one switch coupled to said reference voltage source to receive a positive value of said reference voltage signal.

11. The method according to claim 10,
wherein said state of each comparator module of said plurality of comparator modules defines said plurality of operating regions for said plurality of switches coupled to said each respective capacitor device, for said input voltage signal ranging from said negative value of said reference voltage signal to said positive value of said reference voltage signal.

12. The method according to claim 11, further comprising:
coupling, in each operating region of said plurality of operating regions, only one capacitor device to said output of said amplifier module.

* * * * *